(12) United States Patent
Wu et al.

(10) Patent No.: US 8,198,724 B1
(45) Date of Patent: Jun. 12, 2012

(54) INTEGRATED CIRCUIT DEVICE HAVING A MULTI-LAYER SUBSTRATE AND A METHOD OF ENABLING SIGNALS TO BE ROUTED IN A MULTI-LAYER SUBSTRATE

(75) Inventors: Paul Ying-Fung Wu, Saratoga, CA (US); Dennis C. P. Leung, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 146 days.

(21) Appl. No.: 12/129,527

(22) Filed: May 29, 2008

(51) Int. Cl.
*H01L 29/72* (2006.01)

(52) U.S. Cl. ........ 257/691; 257/692; 257/698; 257/700; 438/15; 438/106; 438/614

(58) Field of Classification Search .................. 257/691, 257/692, 698, 700; 438/15, 106, 614
See application file for complete search history.

(56) References Cited

U.S. PATENT DOCUMENTS

| | | | | |
|---|---|---|---|---|
| 4,551,747 A * | 11/1985 | Gilbert et al. | .................. | 257/691 |
| 5,397,861 A | 3/1995 | Urquhart, II | | |
| 6,396,136 B2 * | 5/2002 | Kalidas et al. | ................. | 257/691 |
| 6,573,590 B1 | 6/2003 | Radu et al. | | |
| 6,822,876 B2 | 11/2004 | Goergen | | |
| 7,239,526 B1 | 7/2007 | Bibee | | |
| 7,242,592 B2 | 7/2007 | Payne et al. | | |
| 7,378,733 B1 | 5/2008 | Hoang et al. | | |
| 7,696,006 B1 | 4/2010 | Hoang et al. | | |
| 2005/0257091 A1 * | 11/2005 | Kyle et al. | ........................ | 714/36 |
| 2008/0251940 A1 * | 10/2008 | Lee et al. | ....................... | 257/777 |

OTHER PUBLICATIONS

U.S. Appl. No. 11/511,833, Wu et al., filed Aug. 29, 2006, "Composite Flip-Chip Package with Encased Components and Method of Fabricating Same", Xilinx, Inc. 2100 Logic Drive, San Jose, CA.
U.S. Appl. No. 12/028,434, filed Feb. 8, 2008 Wu et al., "Method and Apparatus for a Power Distribution System", Xilinx, Inc. 2100 Logic Drive, San Jose, CA.

* cited by examiner

*Primary Examiner* — Edward Wojciechowicz
(74) *Attorney, Agent, or Firm* — John J. King

(57) ABSTRACT

An integrated circuit device having a multi-layer substrate coupled to receive an integrated circuit die and enabling fixed voltage reference signals of a power distribution network and input/output signals to be routed in the integrated circuit device. The multi-layer substrate comprises a first metal layer comprising a reference signal plane of coupling a first fixed voltage reference signal; a dielectric layer positioned on the first metal layer; and a second metal layer having a plurality of conductive traces, wherein the plurality of conductive traces comprise conductive traces for coupling a second fixed reference signal and input/output signals. The plurality of conductive traces may be in a predetermined pattern having reference signal traces and input/output signal traces. A method of enabling different signals comprising reference signals and input/output signals to be routed in a multi-layer substrate adapted to receive a die in an integrated circuit is also disclosed.

19 Claims, 8 Drawing Sheets

INTEGRATED CIRCUIT DEVICE HAVING A MULTI-LAYER SUBSTRATE AND A METHOD OF ENABLING SIGNALS TO BE ROUTED IN A MULTI-LAYER SUBSTRATE

FIELD OF THE INVENTION

The present invention relates generally to integrated circuits, and in particular, to an integrated circuit device having a multi-layer substrate and a method of enabling signals to be routed in a multi-layer substrate.

BACKGROUND OF THE INVENTION

As the density of integrated circuit (IC) devices continues to increase, the number and density of input/output (I/O) connections between the die and the pins of the integrated circuit device continue to increase. A ball grid array (BGA) is an advanced integrated circuit package comprising a substrate having contacts on the bottom for soldering the integrated circuit package to a circuit board. A wire bond BGA comprises a die having contact pads which are bonded to contact pads on the surface of the substrate by way of wire bonds. In contrast, a flip chip BGA comprises a die having contact pads which are directly bonded to the substrate using solder bumps. Unlike in a wire bond BGA, the die having solder bumps is flipped over and placed face down in a flip chip BGA, with the solder bumps connecting directly to corresponding contact pads on the top surface of the substrate. The contact pads on the bottom of the substrate of either type of package are ultimately soldered to a circuit board using solder balls.

However, as both the density of the circuitry and the amount of circuitry for a given integrated circuit continue to increase, the size of the integrated circuit package and the noise associated with circuit continue to be a concern for designers. While a concern in an application specific integrated circuit (ASIC), unwanted noise is a particular problem in programmable devices, such as a programmable logic device (PLD), because of the simultaneous switching output (SSO) of digital circuits of PLDs. A PLD, such as a Field Programmable Gate Array (FPGA) or a Complex Programmable Logic Device (CPLD), is an integrated circuit designed to be programmed by users so that users may implement logic designs of their choices. The size of an integrated circuit, such as a PLD, is also a concern.

SUMMARY OF THE INVENTION

An integrated circuit device having a multi-layer substrate coupled to receive an integrated circuit die and enabling fixed voltage reference signals of a power distribution network and input/output signals to be routed in the integrated circuit device is described. The multi-layer substrate comprises a first metal layer comprising a reference signal plane for coupling a first fixed voltage reference signal; a dielectric layer positioned on the first metal layer; and a second metal layer having a plurality of conductive traces, wherein the plurality of conductive traces comprise traces for coupling a second fixed voltage reference signal and input/output signals. The plurality of conductive traces may be in a predetermined pattern having reference signal traces and input/output signal traces. The integrated circuit device may further comprise a third metal layer comprising the predetermined pattern having reference signal traces and input/output signal traces, where the input/output signal traces of the second metal layer and the third metal layer are staggered, or where the predetermined pattern of the second metal layer is different than the predetermined pattern of the third metal layer.

According to an alternate embodiment, the multi-layer substrate coupled to receive an integrated circuit die and enabling fixed voltage reference signals of a power distribution network and input/output signals to be routed comprises a first metal layer having a plurality of conductive traces for coupling a fixed voltage reference signal and a first plurality of input/output signals; a dielectric layer positioned on the first metal layer; and a second metal layer positioned on the dielectric layer and having a plurality of conductive traces for coupling the fixed voltage reference signal and a second plurality of input/output signals. The plurality of conductive traces of the first metal layer and the second metal layer may comprise a predetermined pattern of power signal traces, ground signal traces and input/output signal traces. The plurality of conductive traces of the second metal layer may also comprise a predetermined pattern of power signal traces, ground signal traces and input/output signal traces which is different than the predetermined pattern of the first metal layer A method of enabling different signals comprising fixed voltage reference signals of a power distribution network and input/output signals to be routed in a multi-layer substrate adapted to receive a die in an integrated circuit device is also disclosed. The method comprises forming a first metal layer having a reference plane for coupling a first fixed voltage signal; forming a dielectric layer on the first metal layer; and forming a second metal layer having a plurality of conductive traces for coupling signals, wherein conductive traces of the plurality of conductive traces are coupled to the reference plane in a predetermined pattern. A third metal layer may also be formed, where conductive traces of the third metal layer may be coupled to the reference plane in a predetermined pattern.

DETAILED DESCRIPTION OF THE DRAWINGS

As will be described in more detail below, various routing arrangements for conductive traces and reference planes including a power signal plane and a ground signal plane coupling fixed voltage reference signals of a power distribution network are disclosed. The routing arrangements provide various degrees of signal-to-power reference (or return loop) and signal-to-ground reference, enabling better control over power resonance that is initiated by simultaneous switching outputs of the signals. According to one embodiment, every I/O signal trace is surrounded by coplanar reference signal traces, with another reference provided by an adjacent reference plane layer. According to another embodiment, every I/O signal trace is surrounded by a ground signal trace on one side and a power signal trace on the other side. According to some embodiments, each I/O is surrounded by both ground and power signal traces that further provide power-to-ground adjacency. While the I/O signal reference schemes provide references to both power and ground rails to exhibit a greatly reduced power resonance on the package, the arrangements of reference planes and/or conductive traces according the embodiments of the present invention increase the trace routing density and may reduce the layer requirement of the substrate. By matching the need for providing signal-to-power reference for resonance reduction without additional layers and for providing dense coplanar trace routing using ultra-fine pitch trace technology, the dual reference routing arrangements of the present invention offers efficient layer utilization and high speed signaling performance.

Figure 1:
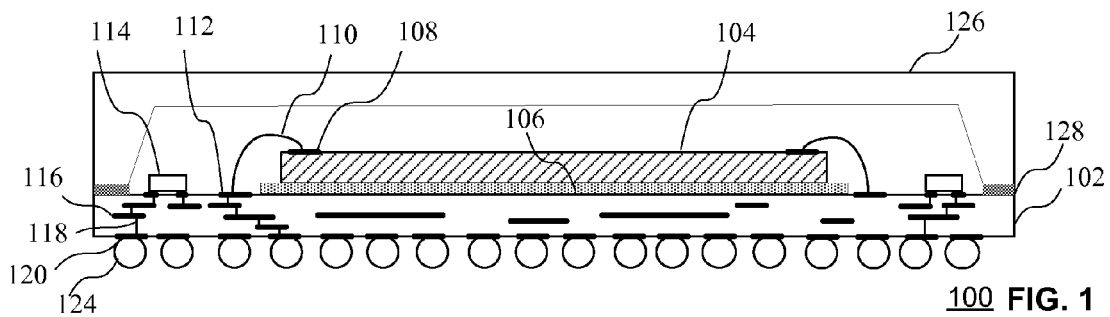
FIG. 1 is a cross-sectional view of an integrated circuit device having wire bonding according to an embodiment the present invention.

Turning first to FIG. 1, a cross-sectional view of an integrated circuit device 100 having wire bonding according to an embodiment the present invention is shown. In particular, a substrate 102 is multi-layer substrate coupled to receive a die 104, such as a silicon die, which may be attached to the substrate by an adhesive 106. As is well known in the art, the die 104 is processed to include elements of circuits which are coupled to contacts and interconnect elements provided by metal layers formed on top of the die. A plurality of bond pads 108 on the top surface of the die enable circuit elements of the die to be coupled to the substrate by way of wire bonds 110 and corresponding contact pads 112 on the substrate. The substrate may also be coupled to receive other discrete elements, such as one or more decoupling capacitors 114. The substrate also includes a plurality of metal layers separated by dielectric layers. As will be described in more detail below, the metal layers may include conductive traces for routing signals or may be a reference plane including a ground plane or power plane providing a fixed voltage reference signal. Vias may also extend from the conductive traces through the dielectric layers to another conductive trace or a reference plane. In some cases, vias may extend through multiple dielectric layers, where a via may be positioned between signal traces on metal layers having signal traces, or extend through a "through hole" of a reference plane. As shown in FIG. 1, a conductive trace 116 of a metal layer is coupled by a via 118 to a contact pad 120 of a plurality of contact pads on the bottom of the integrated circuit device. A plurality of solder balls 124 enable the connection of integrated circuit device to another element, such as a printed circuit board having corresponding contacts for receiving the solder balls. Finally, a lid 126 may be attached to the substrate by an adhesive 128.

Figure 2:
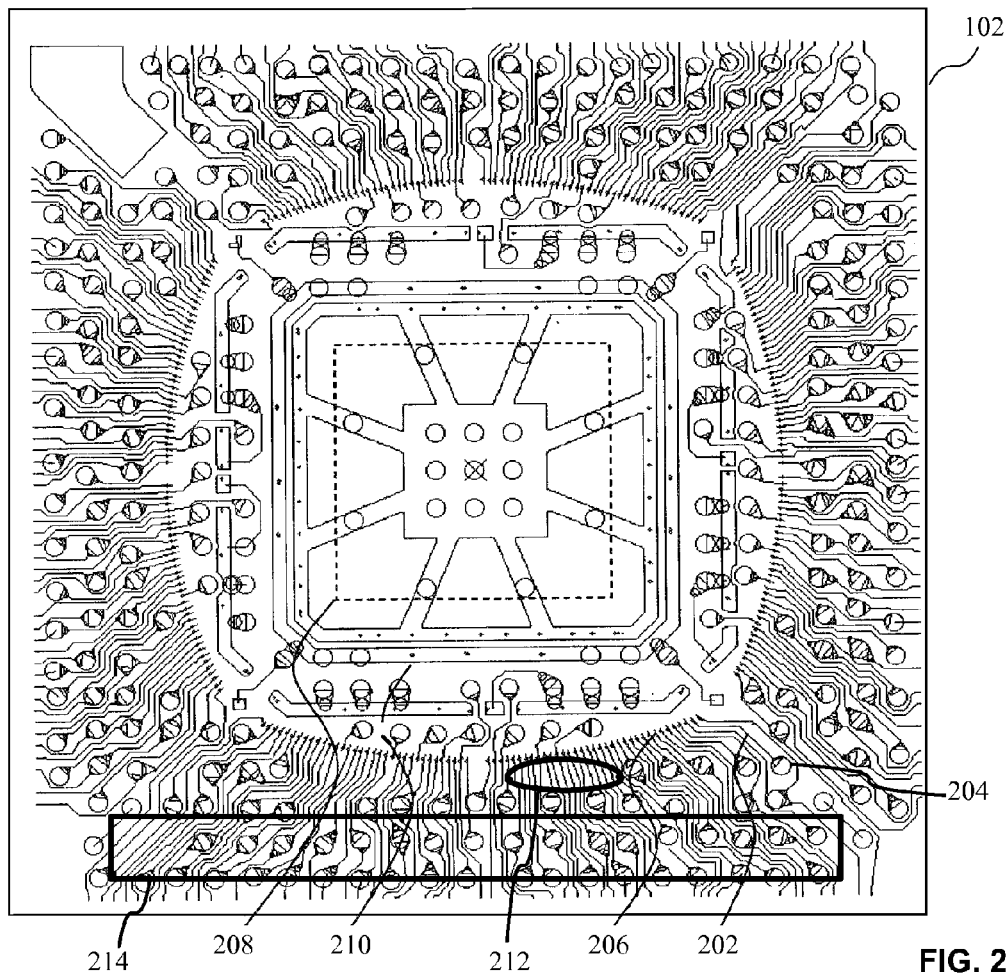
FIG. 2 is a top plan view of a multi-layer substrate of the integrated circuit package of FIG. 1 according to an embodiment of the present invention.

Turning now to FIG. 2, a top plan view of the top layer of a multi-layer substrate of the integrated circuit package of FIG. 1 is shown. In particular, a plurality of conductive traces 202 on the top surface of the substrate 102 are coupled to vias 204 which provide a connection from the conductive traces 202 to conductive traces associated with other metal layers of the integrated circuit device. A plurality of contact pads 206 for receiving a wire bond from the integrated circuit die are coupled to certain conductive traces. As can be seen, the contact pads 206 generally surround an area 208 which would be occupied by the die in a completed integrated circuit package. Vias and traces may also be positioned in an area 210 within the region defined by the contact pads 206. However, one particular area of the substrate which has a high density of conductive traces is an exemplary area 212 on one side of the die where signals coupled to the contact pads 206 are routed away from the die by conductive traces to vias. That is, in the area 212, the conductive traces are particularly close. However, as the conductive traces are connected to vias further away from the contact pads 206 on any side of the die, the density of the conductive traces starts to decrease, as shown in the exemplary area 214 or the area under the die. The high density of the conductive traces in the area 212 provides a particular problem related to noise, as well as the size of the substrate when conventional design constraints must be met. However, according to one aspect of the invention, the conductive traces are coupled in predetermined patterns for coupling input/output signals or fixed voltage reference signals. As will be described in more detail below, the predetermined patterns not only reduce noise in the circuit, but also enable smaller trace widths and spacing between traces, thereby improving performance and reducing the size requirement for a substrate requiring a certain number of input/output signal traces.

Figure 3:
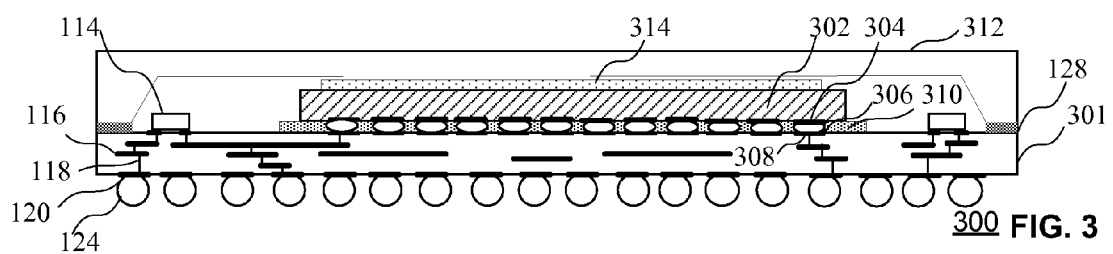
FIG. 3 is a cross-sectional view of an integrated circuit device having a flip chip according to an embodiment of the present invention.

Turning now to FIG. 3, a cross-sectional view of an integrated circuit device 300 having a flip chip according to an embodiment of the present invention is shown. In particular, the die 302 of the integrated circuit device includes contact pads 304 coupled to solder bumps 306 on the bottom of the die enabling a connection to contact pads 308 of the substrate. An underfill 310 may be used beneath the die. Because there is no need for wire bonds, the lid 312 may be smaller and attached to the top of the die by an adhesive 314.

As can be seen in FIG. 3, all return loops and paths for a power signal, commonly designated as VCCio, starting at silicon device bumps, enroute to the on-package decoupling capacitor (decap), and finishing at the BGA pins are provided. Since these three port locations, namely die bumps, decap contacts, and IC pins, may not be arranged in a linear fashion, all pairwise paths, such as bump-to-decap, bump-to-pin, and decap-to-pin need to be implemented, so that all possible return loop segments are complete. While an on-package decap may be beneficial to overall performance, its usage is optional and subject to a cost versus performance tradeoff.

Figure 4:
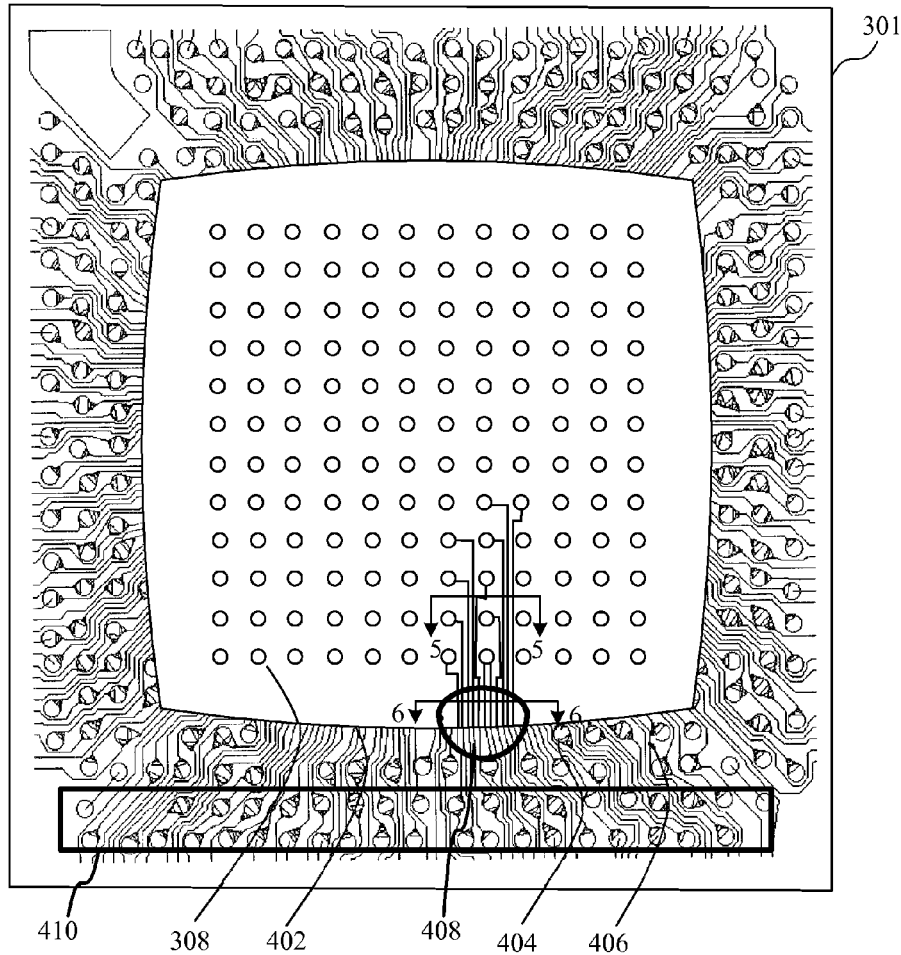
FIG. 4 is a top plan view of a multi-layer substrate of the integrated circuit package of FIG. 3 according to an embodiment of the present invention.

As shown in FIG. 4, which is a top plan view of the multi-layer substrate of the integrated circuit package of FIG. 3, conductive traces or vias must be provided to enable signals coupled to the contact pads 308 on the top surface of the substrate to be routed in the substrate. The conductive traces provided in FIG. 4 are shown to highlight that the density of the traces increases from the center of the region 402 to be occupied by the die toward the edge of the substrate. Vias 404 are coupled to various conductive traces 406. Representative conductive traces extending from contact pads 308 away from the edge of the die show how certain areas providing "escape paths" for routing signals out from under the die have dense routing patterns compared to other areas of the substrate. As can be seen, an exemplary area 408 has a high density of conductive traces. Only some of the conductive traces leading away from the contact pads 308 are shown in FIG. 4 to show the area 408 having a high density of conductive traces. However, it should be understood that many more conductive traces and contact pads 308 would be used, including conductive traces leading away from the contact pads 308 to other sides of the substrate. Further, some of the contact pads 308 may be coupled to vias leading to other layers of the substrate, where conductive traces would also lead away from the contact pads under the die to a side of the substrate. The increased density of the traces will also be visible in the cross-sectional views of FIGS. 5 and 6, taken at lines 5-5 and 6-6, respectively.

Although a top plan view of the top layer is provided, other layers will encounter the same problems of density. For example, some of the vias under the die may be used to route a signal from a solder bump at the center of the die to conductive traces on a lower layer, where those conductive traces are used to route the signals out and away from the edge of the die and would also have a high density as shown in the top layer. Further, while specific examples of regions having a high density of conductive traces is shown, the arrangement of conductive traces and layers of the present invention may be employed in any portion of the substrate. That is, while the conductive traces leading signals away from the die provide one example of a region having conductive traces which must be placed close together, there may be a need to place conductive traces close together in any other region on any other layer. The arrangement of conductive traces and reference planes in the various layers reduce the number of metal layers and signal noise, which will be described in more detail in reference to FIGS. 5-16.

Figure 5:
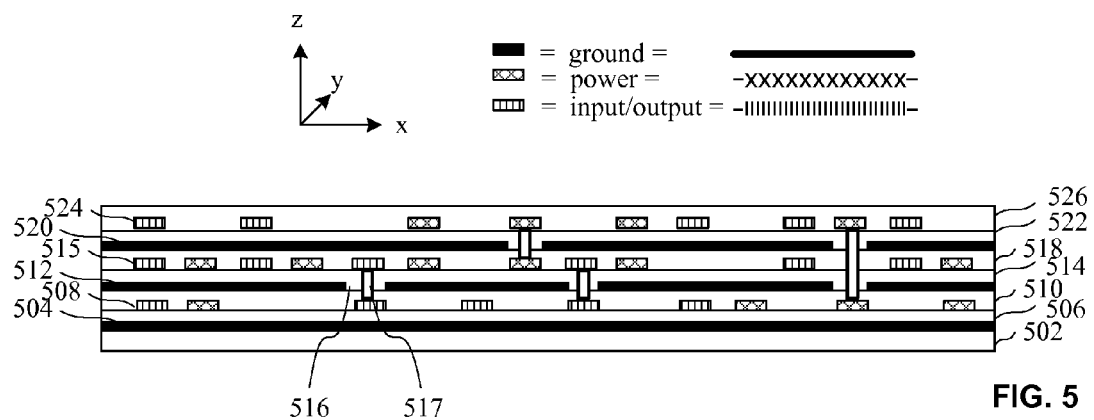
FIG. 5 is a cross-sectional view of a multi-layer substrate having ground planes in a low density routing area according to an embodiment of the present invention.

Turning now to FIG. 5, a cross-sectional view of a multi-layer substrate having ground planes in a low density routing area taken at lines 5-5 of FIG. 4 is shown. In order to simplify the description of the location of the traces and reference planes in the cross-sectional views, a conventional x-y-z coordinate designation has been provided, as well as a signaling convention which indicates the type of signal which is routed on a conductive trace or reference plane. That is, each of an input/output signal trace and signal traces for power and ground signals are provided with different designations. While the input/output signal traces may provide any signal required by the die, they are designated as input/output signal traces because they are signal traces other than for power or ground signals, and enable a signal to be input to or output from the die by way of the solder bumps on the die and/or the integrated circuit device itself by way of the solder balls on the integrated circuit device.

In the art of package design for an integrated circuit device, a design constraint for routing signal traces in a substrate to enable controlling cross-talk among adjacent traces may require that the spacing between traces be at least two times of the height of the dielectric layer that separates the metal layers providing signal traces and a reference plane, such as a ground plane. However, with the advent of the ultra-fine trace pitch technology, the minimum trace width and the minimum spacing between traces of the metal layers of the substrate is significantly smaller than the height of the dielectric material separating traces. Accordingly, the conventional design constraint limits the benefit in terms of density that the ultra-fine trace pitch technology would provide. By way of example, if the dielectric thickness between the metal layers is 30 micrometers ($\mu m$), while the trace width and the spacing between the traces are set at 30 $\mu m$ and 60 $\mu m$, respectively, then an effective trace pitch of 90 $\mu m$ is achieved, where the trace pitch is the distance from the side of a first trace, across the trace and spacing, to the side of the next trace. Accordingly, if the trace patterning technology may support a line width of 10 $\mu m$ and a spacing of 10 $\mu m$ for the same dielectric thickness of 30 $\mu m$, a theoretical trace pitch of 20 $\mu m$ (i.e., 10 $\mu m$+10 $\mu m$) is possible. However, it may not be allowed by the design constraint, which dictates a looser trace pitch of 70 $\mu m$ (i.e., 10 $\mu m$+60 $\mu m$). Accordingly, there is a 3.5× density penalty factor as a result of the design constraint. By implementing the conductive traces and reference planes according to the embodiments of FIG. 5, or other embodiments of the invention, power resonance and noise in the package will be reduced to allow a reduced trace pitch in the substrate of the integrated circuit device.

As shown in FIG. 5, metal layers having conductive traces for different signal types are provided. In particular, a first dielectric layer 502 is provided, upon which a metal layer 504 may be formed. A dielectric layer is used to separate each of the metal layers, where a dielectric layer 506 is placed over the metal layer 504. According to the embodiment of FIG. 5, the metal layer 504 includes a reference plane, which is a ground plane in this case. As will be visible in FIG. 14*b*, the ground plane covers substantially all of the area of the substrate, but may include through holes to enable vias to extend through the ground plane to another layer. That is, unlike input/output signal traces which enable specific signals to be routed between various nodes of the substrate, a reference plane provides a fixed voltage reference voltage coupling a ground signal or a power signal such as VCCio to various nodes of the integrated circuit device.

A metal layer 508 is then applied on the dielectric layer 506. As can be seen, the metal layer includes a number of traces extending in the "y" direction, and in the embodiment of FIG. 5, includes both conductive traces for coupling input/output signals as well as a power signal. As described in reference to FIG. 6 below, the density of the conductive traces in the region of the substrate of FIG. 5 is less then the density of the conductive traces in the region of the substrate in FIG. 6. As will further be described in reference to FIG. 6, the conductive traces are placed in a pattern of alternating power and input/output signals. After a dielectric layer 510 is applied over the conductive traces, another metal layer 512 including a ground plane is applied. Another dielectric layer 514 is applied over the conductive traces of the metal layer 512, upon which more conductive traces for routing input/output signals and a power signal of a metal layer 515 are provided. As shown, a through hole 516 enables a via 517 to couple two conductive traces routing an input/output signal. A dielectric layer 518 is then placed upon the conductive traces of the metal layer 515, and another ground reference plane is provided by a metal layer 520. Finally, conductive traces are provided over a dielectric layer 522, where the conductive traces of the metal layer 524 also route input/output signals and the power signal. A protective layer 526, which may be a dielectric layer, is provided over the conductive traces of the metal layer 524. Contacts may be made to the conductive traces by etching portions of the protective layer.

Figure 6:
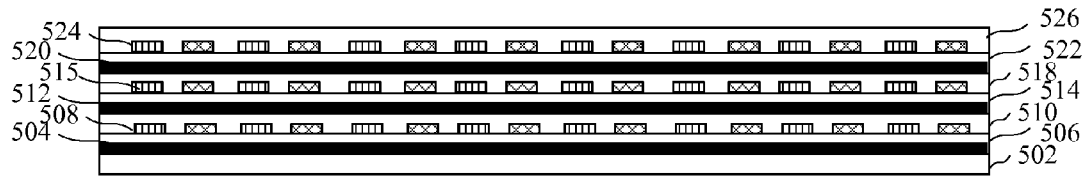
FIG. 6 is a cross-sectional view of a multi-layer substrate having ground planes near an edge of a die according to an embodiment of the present invention.

In contrast to the conductive traces of the portion of the substrate shown in FIG. 5, the conductive traces of FIG. 6, which is taken at lines 6-6 of FIG. 4, shows the increased density of the traces at that point. Also visible in FIG. 6 is a pattern of conductive traces including alternating input/output signal traces and power traces. By using conductive traces on a given metal layer for both input/output signals and power signal traces, a metal layer providing a power plane is not necessary, thereby eliminating a metal layer in the substrate. Further, by placing the power traces between I/O signal traces, cross talk between the input/output traces is reduced, enabling a smaller trace pitch. While a substrate having seven metal layers is shown by way of example in FIGS. 5 and 6, the configuration of FIGS. 5 and 6 may be applied to substrates having any number of metal layers. Further, seven metal layers are shown in the remaining FIGS. 7-12 to enable a comparison of the various embodiments. However, any number of layers may also be used in each of those figures.

Figure 7:
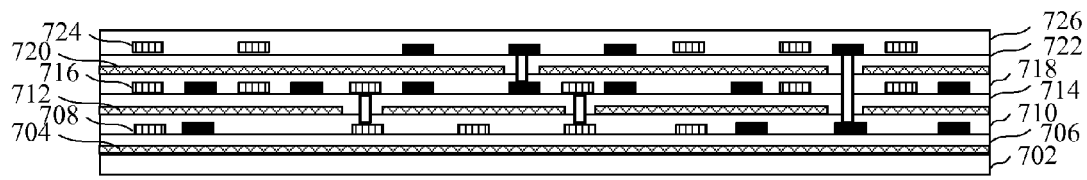
FIG. 7 is a cross-sectional view of a multi-layer substrate having power planes near an edge of a die according to an embodiment the present invention.

Turning now to FIG. 7, a cross-sectional view of a multi-layer substrate having power planes near an edge of a die is shown. While the embodiment of FIG. 5 shows ground planes between metal layers having input/output signal traces and power signal traces, power planes may be provided in place of ground planes, and ground signal traces may be provided in place of the power signal traces. That is, power reference planes 704, 712 and 720 are provided in place of the ground reference planes 504, 514 and 520, while ground signal traces are provided in metal layers 708, 716 and 724 in place of the power signal traces in metal layers 508, 516 and 524. While a single power reference voltage is shown in FIG. 7, it should be noted that different power reference voltages may be provided, either in different planes, or in different portions of a single plane. While the cross-sectional views of FIGS. 5 and 7 are taken at lines 5-5 of FIG. 4, the remaining cross-sectional views in the embodiments of FIGS. 8-12 are taken at lines 6-6 to more clearly show the pattern of conductive traces of the various layers. Further, while the cross-sectional views of FIGS. 6 and 8-12 show an arrangement having a maximum density of conductive traces to show the pattern of conductive traces, it should be understood that conductive traces need not be located at each possible location for a trace.

Figure 8:
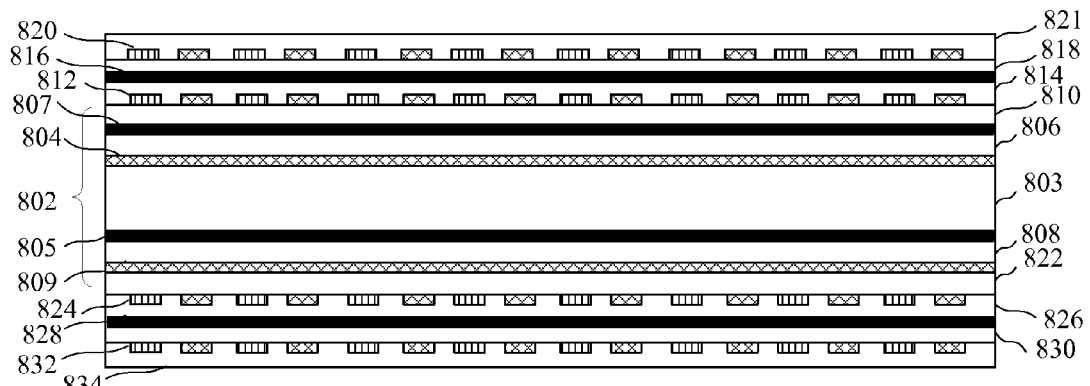
FIG. 8 is a cross-sectional view of a multi-layer substrate having a core including power and ground planes near an edge of a die according to an embodiment of the present invention.

Turning now to FIG. 8, a cross-sectional view of a multi-layer substrate having a core including power and ground planes near an edge of a die is shown. As can be seen in FIG. 8, unlike the "core-less" structures of FIGS. 5-7 having thin dielectric layers, a core 802 is provided, where one or more dielectric layers of the core have a significantly greater thickness, and therefore provide greater strength for the substrate. According to the embodiment of FIG. 8, metal layers are applied to a thick dielectric layer 803, where a first metal layer 804 including a power plane is applied on a first side and a second metal layer 805 including a ground plane is provided on a second side of the dielectric layer 803. A dielectric layer 806 is formed on the power plane of the metal layer 804, upon which another metal layer 807 including a ground plane is formed. A dielectric layer 808 is also formed on the ground plane of the metal layer 805, upon which another metal layer 809 including a power plane is formed. While the dielectric layers 806 and 808 between the reference signal planes may be generally thin to enable better coupling, thick layer 803 may be formed to provide a stronger core, as will be described in more detail below in reference to FIG. 12. However, in other embodiments where conductive traces in a single plane are used for input/output signals, power signals and ground signals, the core may include multiple layers having a thick dielectric. A dielectric layer 810 is applied on the metal layer 807, upon which a metal layer 812 is applied. The metal layer 812 also includes alternating conductive traces coupling input/output signals and a power signal. After a dielectric layer 814 is applied, another metal layer 816 including a ground plane is applied. Finally, a dielectric layer 818 and a metal layer 820 having the pattern of alternating conductive traces coupling input/output signals and a power signal. A protective layer 821, such as a dielectric layer, may be applied to the metal layer 820.

Layers are then applied to the other side. In particular, another thick dielectric layer 822 is applied on the power plane of metal layer 809, upon which a metal layer 824 including alternating conductive traces coupling input/output signals and a power signal is applied. After a dielectric layer 826 is applied, another metal layer 828 including a ground plane is applied. Finally, a dielectric layer 830 and a metal layer 832 having alternating conductive traces coupling input/output signals and a power signal. A protective layer 834 may also be applied to the metal layer 832. While the layers are described as being formed on one side of the core followed by the other, the alternating metal and dielectric layers may be formed progressively on both sides of the core. For example, metal layers may be formed simultaneously on both sides of a dielectric of the core, followed by dielectric layers formed simultaneously on metal layers on both sides of the core. While the main design principle of the embodiments of FIGS. 5-8 is to have each I/O signal trace surrounded by a power from both sides of the trace, deviations from the main design principle could include a power signal trace next to a power signal trace associated with a different power supply for the next adjacent bank. That is, multiple power traces associated with different power supplies may be provided between input/output signal traces.

Figure 9:
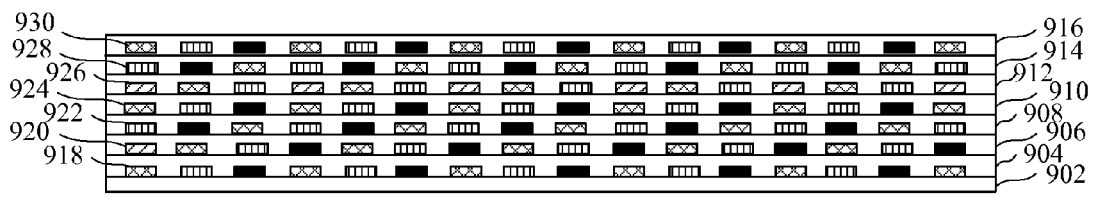
FIG. 9 is a cross-sectional view of a multi-layer substrate including metal layers having conductive traces for a plurality of signal types near an edge of a die according to an embodiment of the present invention.

Turning now to FIG. 9, a cross-sectional view of a multi-layer substrate including metal layers having conductive traces for a plurality of signal types near an edge of a die is shown. While an input/output signal reference scheme that provides references to both power and ground rails in an integrated circuit exhibits a reduced power resonance on the package when compared to an input/output scheme having only a ground reference, implementing a dual reference scheme may dictate having a signal layer with an adjacent ground layer (i.e., above or below) and another adjacent power layer (i.e., above or below, but on the side opposite the ground layer). Such an arrangement incurs a higher cost due to a higher overall layer count. The main design principle of the embodiment of FIG. 9 is to have each I/O signal trace surrounded by a power signal trace on one side and a ground signal trace on the other side. As shown in FIG. 9, a substrate has alternating layers of dielectric layers and metal layers, where the metal layers include conductive traces for input/output signals and both of the fixed voltage reference signals.

In particular, after a base dielectric layer 902 is applied, alternating dielectric layers 904-916 and metal layers 918-930 are applied. The metal layers include a recurring pattern including each of an input/output signal trace and the reference signal traces. As can be seen, each input/output signal trace is separated from another input/output signal trace by both a power signal trace and a ground signal trace. Because there are no reference planes between the metal layers having signal traces, the metal layers are also preferably staggered so that the input/output signals are not aligned with each other in the "z" direction for a duration that exceeds a reasonable maximum length to reduce crosstalk between those metal layers. For example, each successive metal layer could be shifted by one conductive trace, as shown in FIG. 9.

Figure 10:
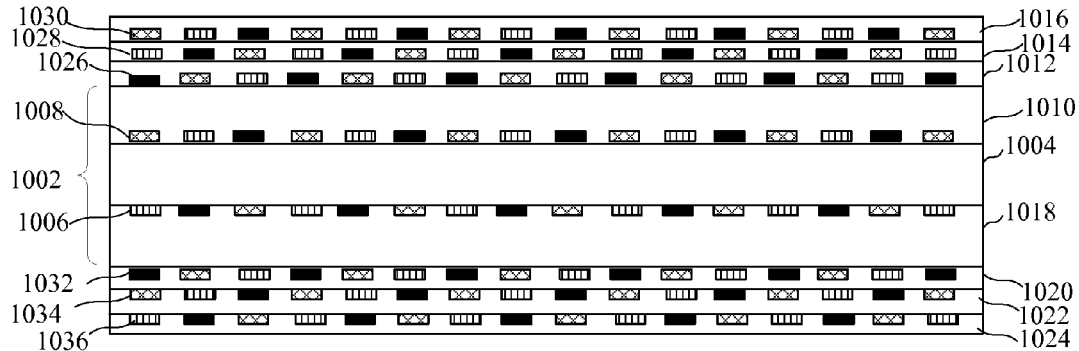
FIG. 10 is a cross-sectional view of a multi-layer substrate having a core and including metal layers having conductive traces for a plurality of signal types near an edge of a die according to an embodiment the present invention.

Turning now to FIG. 10, a cross-sectional view of a multi-layer substrate having a core and including metal layers having conductive traces for a plurality of signal types near an edge of a die according to an embodiment the present invention is shown. According to the embodiment of FIG. 10, a core 1002 is used, including a dielectric layer 1004, upon which metal layers 1006 and 1008 having conductive traces according to the predetermined pattern of conductive traces and alignment of layers set forth above with respect to FIG. 9. Alternating layers including dielectric layers 1010-1024 and metal layers 1026-1036 are provided as shown.

Figure 11:
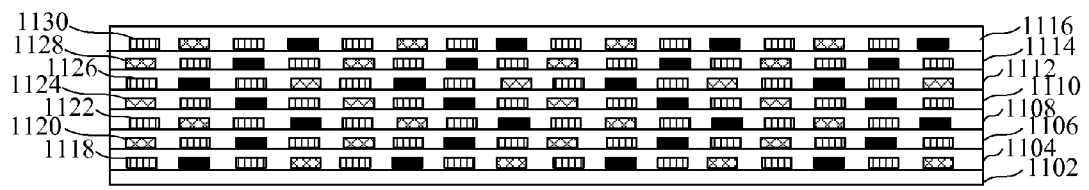
FIG. 11 is a cross-sectional view of a multi-layer substrate including metal layers having conductive traces for a plurality of signal types near an edge of a die according to an alternate embodiment of the present invention.

Turning now to FIG. 11, a cross-sectional view of a multi-layer substrate including metal layers having conductive traces for a plurality of signal types near an edge of a die according to an alternate embodiment of the present invention is shown. As shown in FIG. 11, a substrate having alternating layers of dielectric layers and metal layers, where the metal layers include conductive traces for input/output signals and both of the fixed voltage reference signals. In particular, after a base dielectric layer 1102 is applied, alternating dielectric layers 1104-1116 and metal layers 1118-1130 are applied. The metal layers include a recurring pattern including each of the input/output signals and the fixed voltage reference signals. As can be seen, each input/output signal trace is separated from another input/output signal trace by one of a power signal trace and a ground signal trace, and each input/output signal trace is adjacent to both a power signal trace and a ground signal trace. The metal layers are also preferably staggered so that the input/output signals are not in line with each other to reduce crosstalk between those metal layers. For example, each successive metal layer could be shifted by one conductive trace, as shown in FIG. 11.

Figure 12:
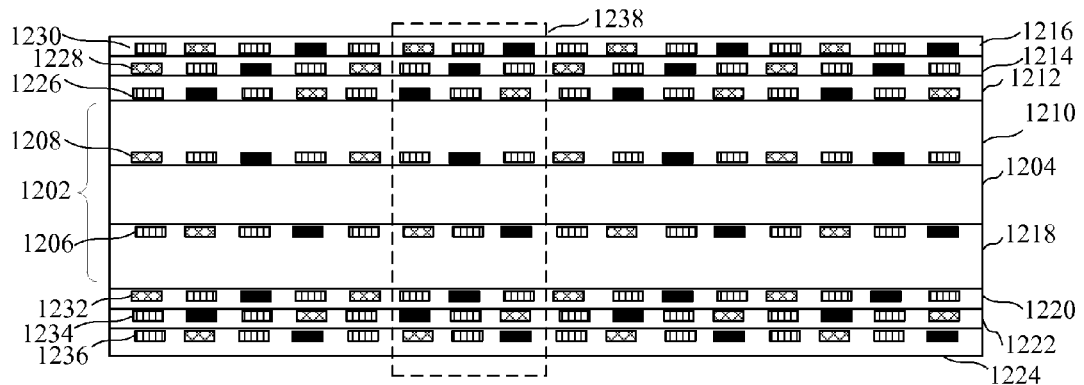
FIG. 12 is a cross-sectional view of a multi-layer substrate having a core and including metal layers having conductive traces for a plurality of signal types near an edge of a die according to an alternate embodiment the present invention.

Turning now to FIG. 12, a cross-sectional view of a multi-layer substrate having a core and including metal layers having conductive traces for a plurality of signal types near an edge of a die is shown. According to the embodiment of FIG. 12, a core 1202 is used, including a dielectric layer 1204, upon which metal layers 1206 and 1208 having conductive traces according to the predetermined pattern of conductive traces and alignment of layers set forth above with respect to FIG. 11. Alternating layers including dielectric layers 1212-1224 and metal layers 1226-1236 are provided.

The main design principle of the embodiments of FIGS. 11 and 12 is to have each I/O signal trace surrounded by power on one side and ground on the other side and, additionally, have power signal traces adjacent to ground signal traces. As long as the I/O signal trace adjacency is fully provided, the power-to-ground adjacency may not need be strictly enforced. That is, the power-to-ground coupling could be less than the uniform arrangement shown in FIGS. 11 and 12. These deviations may arise from bump topology limitations or bump/trace pitch limitations in the actual bump pattern to which the arrangement is applied. Irregular mixing of ground and power adjacencies may also be employed. More specifically, the routing pattern may contain ad hoc mixture of traces that have either two ground adjacencies, or one power adjacency and one ground adjacency, or two power adjacencies. While the system behavior as a result of such mixtures may be more complex to predict, the arrangement may be acceptable to a preset design objective.

While the embodiment of FIGS. 9-12 do not require a ground plane or a power plane, it should be understood that one or more of the metal layers could be a ground plane and/or a power plane, where the metal layers having the conductive traces would still have the recurring pattern of the input/output signal traces, ground signal traces and power signal traces. Although conductive traces of the metal layers of FIGS. 9-12 appear to be generally aligned, the conductive traces need not be aligned as shown, and may be in a less uniform arrangement based upon the location of vias or other factors which may affect the positioning of the traces.

Accordingly, tightly coupled I/O and power distribution routing configurations in substrate of a semiconductor package enables strong power supply resonance rejection and low crosstalk between I/O-to-I/O signal traces, reaping the high density benefits of interconnect technology that supports fine trace pitch design rules. By implementing a coplanar routing template where signal traces are interleaved with reference traces, the trace pitch of a layer of the substrate may be greatly reduced. For example, an effective trace pitch of 40 um (10 μm ground, 10 μm spacing, 10 μm signal, 10 μm spacing) can be achieved. By removing the reference plane layers, a cost saving resulting from a layer count reduction may be achieved, where the coplanar routing arrangements provide adequate signal referencing (or return path). For example, layer count reduction, from 3+4+3 down to 3+2+3 or 2+2+2, or from 3+6+3 down to 3+4+3, 3+2+3, or 2+2+2, may be achieved by the removal of ground and/or power planes that are no longer necessary in the new routing arrangements, where the middle number represents the number of metal layers in the core.

Although the different configurations are useful in their own right for different optimization purposes, the embodiments of FIGS. 5-8 offer a higher degree of reference coupling than the embodiments of FIGS. 9 and 10, while having the same effective signal pitch. The embodiments of FIGS. 9 and 10 have the potential of further reducing layers as the ground reference layer that is required by the embodiments of FIGS. 5-8 is optional for the embodiments of FIGS. 9 and 10. But without having a reference ground layer, the provisioning of return loops may be more challenging to design, especially for escape traces in the bump region. Further, signal-to-signal crosstalk may be higher. The embodiments of FIGS. 9 and 10 provide stronger power-to-ground reference, while giving a looser signal pitch. For example, assuming a 10 μm trace width and a 10 μm spacing between traces, the embodiment of FIGS. 9 and 10 gives 60 μm pitch versus 40 μm in the embodiment of FIGS. 5-8 and 11-12. The embodiments of FIGS. 9 and 10 may be particularly beneficial when the trace pitch technology shrinks further with the same dielectric thickness. For example, if the minimum trace pitch that may be supported shrinks to 7 μm line width and 7 μm spacing while the dielectric thickness stays at 30 μm, the embodiments of FIGS. 5-8 and 11-12 will support an effective signal trace pitch of 28 μm while the embodiments of FIGS. 9 and 10 will support a signal pitch of 42 μm. While it may seem that a tighter signal trace pitch of 28 μm would be preferred, it may be result in too much crosstalk among signals for certain applications. Thus, if a 42 μm signal pitch is adequate for providing conductive traces for escaping all signals properly, the embodiments of FIGS. 9 and 10 would offer a better overall solution. Among the various embodiments, the embodiments of FIGS. 5-8 are the easiest to implement in trace routing, as bussing of VCCio bumps and spreading VCCio to shadow all I/O signal traces is topologically straightforward, while the embodiments of FIGS. 9-12 which have the intermixing of I/O, power, and ground signal traces present a complex topology and may suffer density degradation from the density that is theoretically possible. These benefits and design challenges represent tradeoffs that need to be made in an actual design. While the embodiments of FIGS. 6-12 show metal layers having conductive traces, where each metal layer has the same pattern, each of the embodiments could include metal layers having different patterns of conductive traces.

Figure 13:
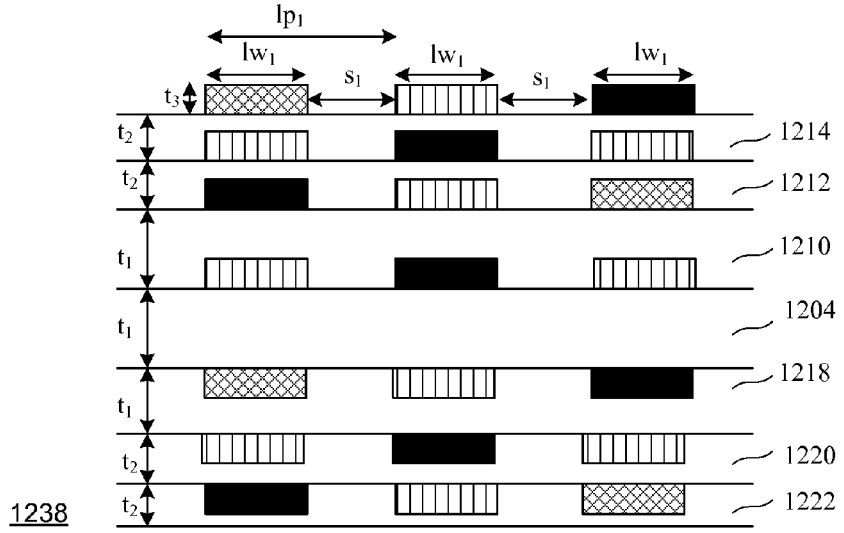
FIG. 13 is a cross-sectional view of a portion of a multi-layer substrate showing exemplary dimensions according to an embodiment the present invention.

Turning now to FIG. 13, a cross-sectional view of a portion 1238 of the multi-layer substrate of FIG. 12 shows exemplary dimensions according to an embodiment the present invention. In particular, the thick dielectric layers 1204, 1210 and 1218 may have a thickness $t_1$ of approximately 800 μm, and may be in the range of approximately 100 μm to 1000 μm. In contrast, the remaining buildup dielectric layers outside the core include thin layers which may have a thickness $t_2$ of approximately 30 μm, but may be in a range of approximately 25-60 μm. The dielectric layers may include an organic resin material applied using a laminated substrate technology, for example, but could be any material providing electrical isolation between the metal layers formed using a technique for applying a dielectric layer. The metal layers may have a thickness $t_3$ which may be approximately 15 μm, and may be in a range of approximately 10 μm to 30 μm. The conductive traces of the metal layers may have a line width of approximately 10 microns, and may be separated by a minimum spacing $s_1$ of approximately 10 μm, leading to a trace pitch $tp_1$ of approximately 20 μm. The metal layers may include Copper. According to alternate embodiments, Tungsten or Aluminum may be used. However, any suitable conductive material may be used, and applied using known techniques such as metal deposition and etching techniques. While the dimensions are shown by way of example according to current techniques and for the purpose of showing the reduced requirements for the spacing between conductive traces, dielectric layers, metal layers and conductive traces having other dimensions may be employed according to the various embodiments of the present invention. Depending upon the application of the integrated circuit device, the speed of the signaling, and other factors, the spacing may be adjusted to ensure signal integrity. While the patterns may be applied across the entire layer of the substrate, the patterns need not be applied uniformly across the entire layer. Deviations may be made in certain areas to enable the routing of traces. That is, the patterns may be applied in a majority of the traces in the layer to enable improved performance and size reduction, where a selected amount of deviation from the pattern will not significantly affect the performance.

Figure 14A:
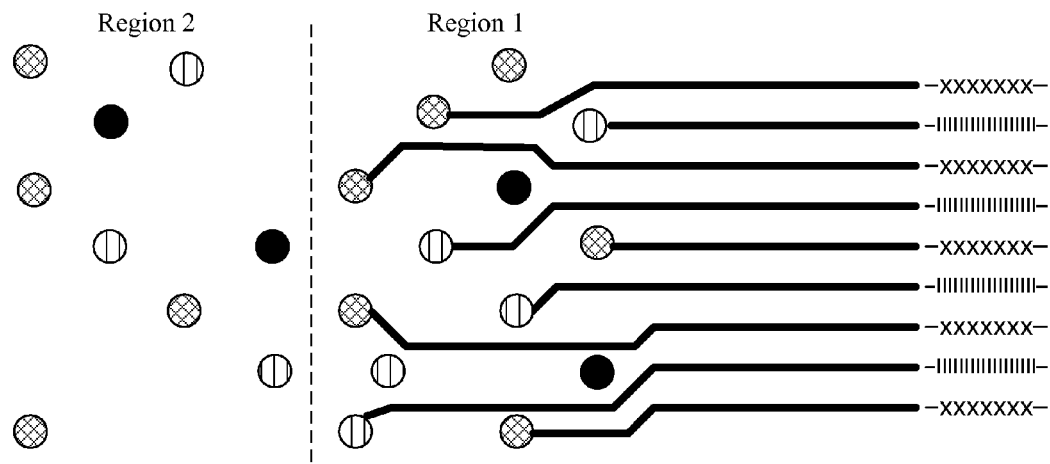
FIG. 14 is a series of top plan view drawings showing three layers of metal layers for routing signals according to the embodiments of FIGS. 6 and 8 of the present invention.
Figure 14B:
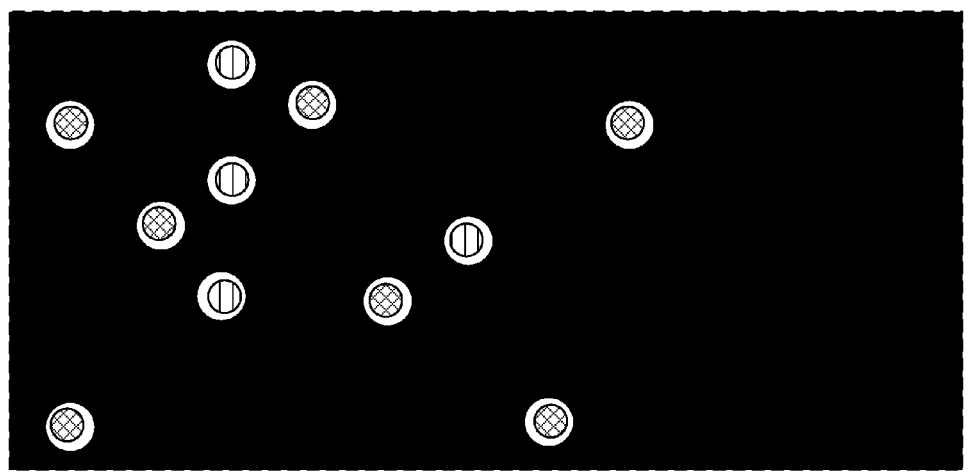
Figure 14C:
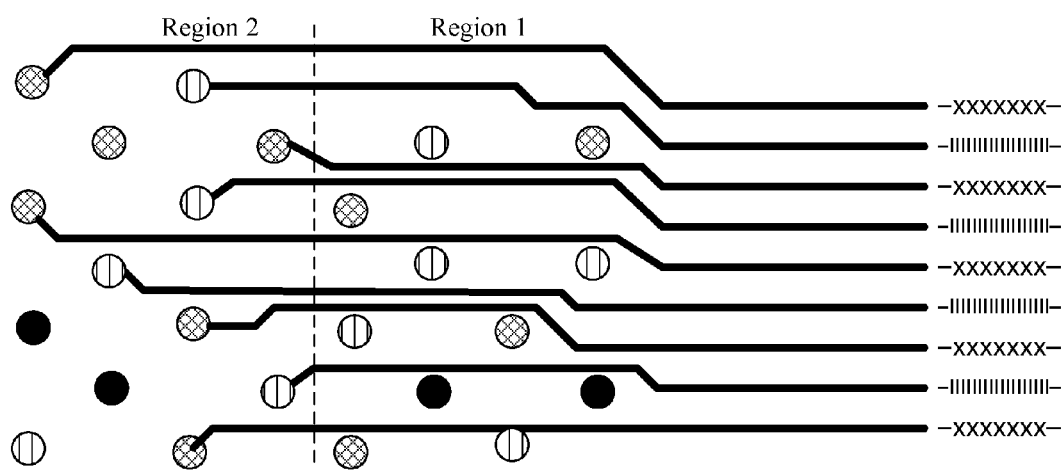
Figure 15A:
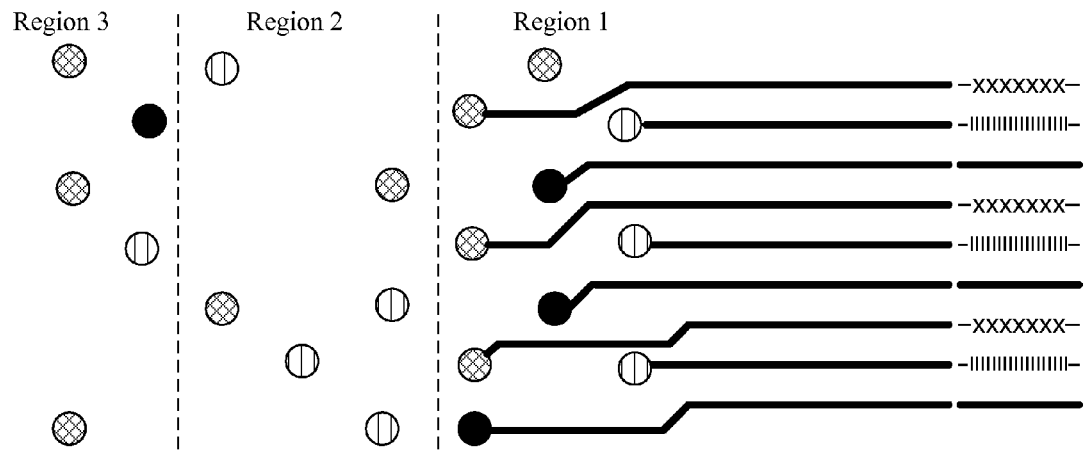
FIG. 15 is a series of top plan view drawings showing three layers of metal layers for routing signals according to the embodiments of FIGS. 9 and 10 of the present invention.
Figure 15B:
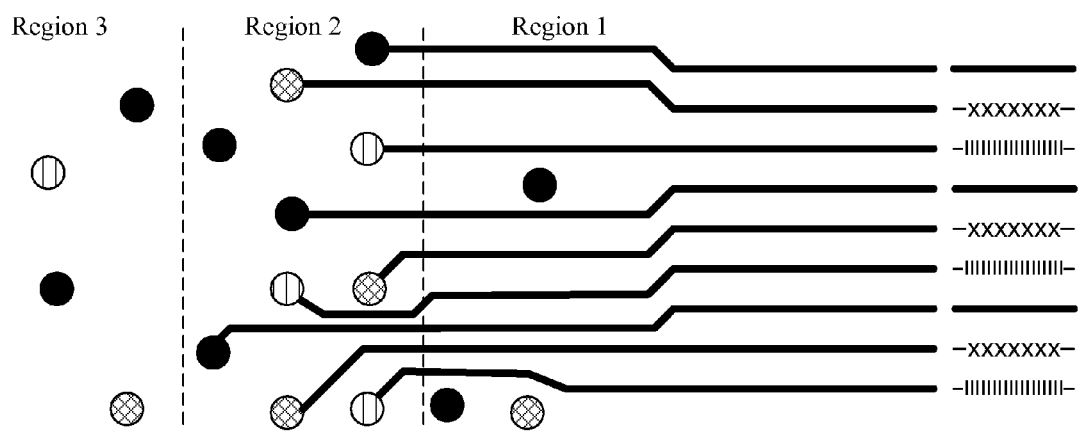
Figure 15C:
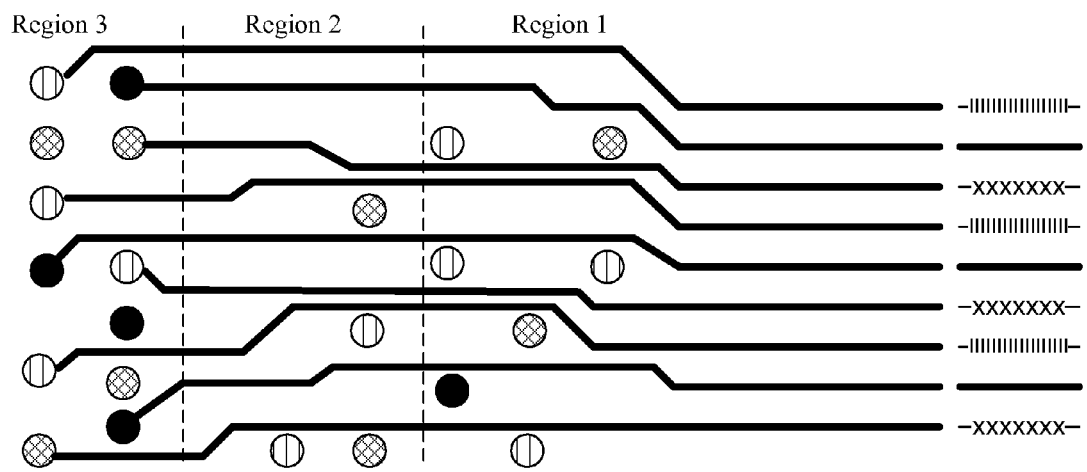
Figure 16A:
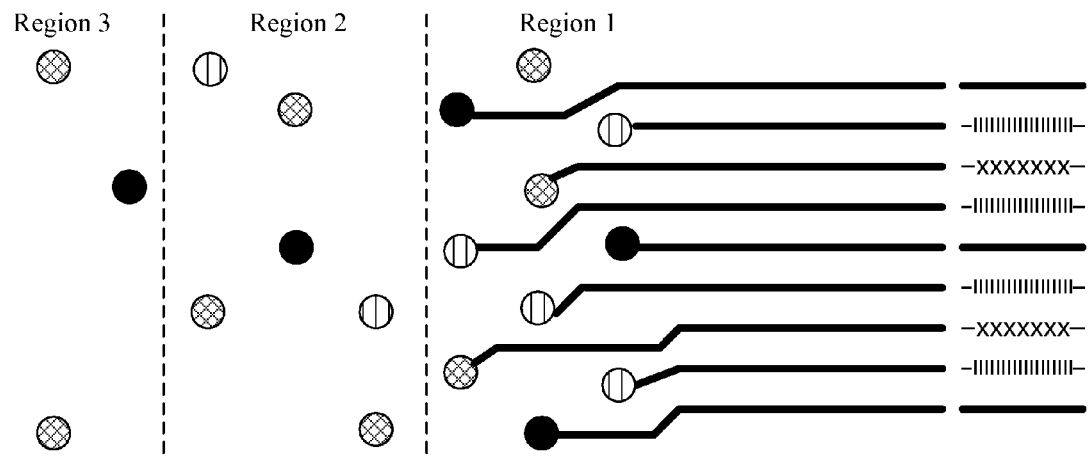
FIG. 16 is a series of top plan view drawings showing three layers of metal layers for routing signals according to the embodiments of FIGS. 11 and 12 of the present invention.
Figure 16B:
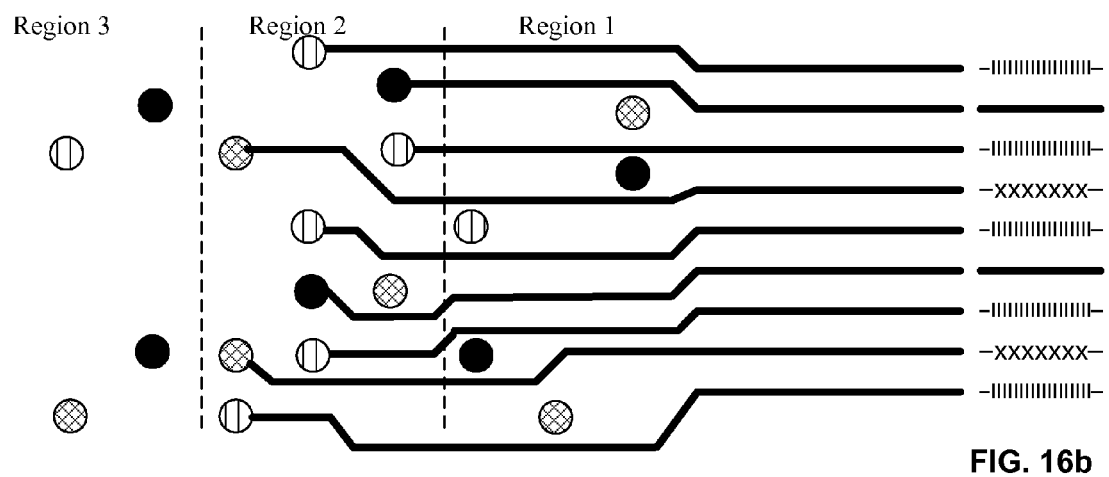
Figure 16C:
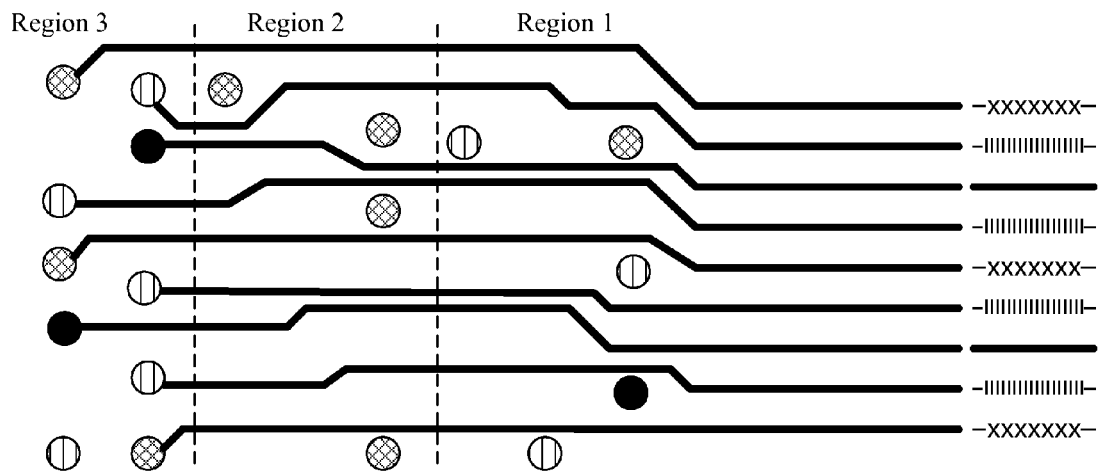

Turning now to FIGS. 14-16, a series of top plan view drawings shows three metal layers for routing signals according to the embodiments of FIGS. 6 and 8-12 of the present invention. In particular, FIGS. 14-16 show how conductive traces in different layers are used to route signals in different regions out from the center of the substrate under or near a die toward an edge of the substrate. These figures also show how, in each of the layers, the conductive traces which end up in an area having greater density are arranged in a predetermined pattern, as well as having a staggered alignment between the various layers. FIG. 14 particularly shows three layers of the embodiments of FIGS. 6 and 8, where the conductive traces of FIG. 14a show routing for vias in a region 1 while the conductive traces of FIG. 14c show the routing for vias in a region 2. Because the layers of FIGS. 14a and 14c are separated by the ground plane shown in FIG. 14b, the conductive traces of those layers do not need to be staggered, although they could be staggered. While the regions are shown divided with a dashed line, the boundaries for the regions are arbitrary, and used to generally define regions to simplify the routing.

In contrast to FIG. 14, the top plan views of three layers of FIGS. 15 and 16 show how the three layers are used to route signals from vias in three regions using a predetermined pattern which is staggered between the layers. In particular, each successive layer is staggered by one conductive trace so that the conductive traces routing the input/output signals in different layers are not adjacent to one another in the "z" direction, where the staggering is particularly important away from the core where they are separated by thin dielectric layers. The layers of FIG. 15 show three different layers corresponding to three layers of the embodiment of FIGS. 9 and 10, while of layers of FIG. 16 show three different layers corresponding to three layers of the embodiments of FIGS. 11 and 12.

Figure 17:
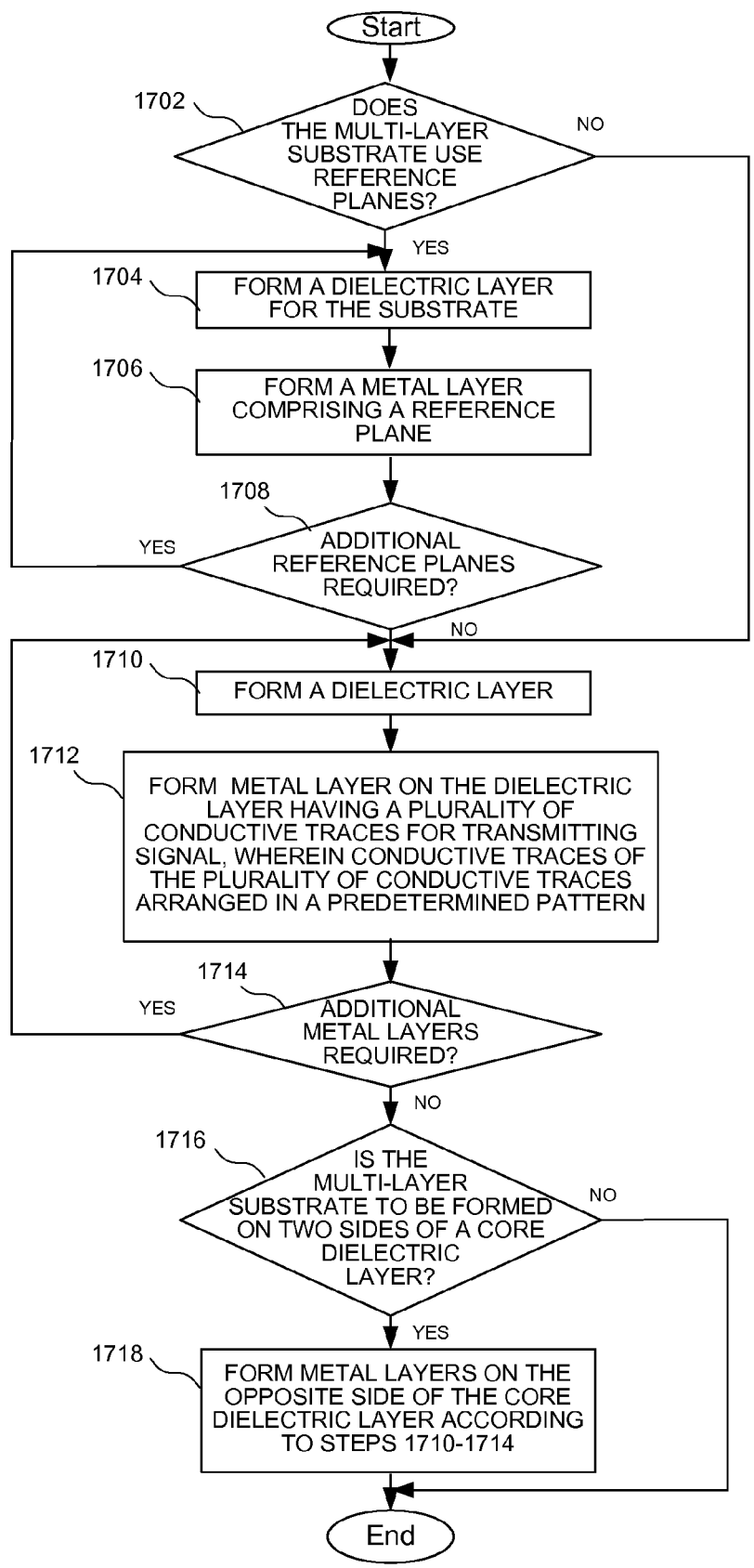
FIG. 17 is a flow chart showing a method of enabling different signals including fixed voltage reference signals and input/output signals to be routed in a multi-layer substrate according to an embodiment the present invention.

Finally, turning to FIG. 17, a flow chart shows a method of enabling different signals including fixed voltage reference signals and input/output signals to be routed in a multi-layer substrate according to an embodiment the present invention. In particular, it is first determined whether a multi-layer substrate uses reference planes at a step 1702. If so, a dielectric layer is formed for the multi-layer substrate at a step 1704, and a metal layer including a reference plane is formed on the dielectric layer at a step 1706. The dielectric may include a core dielectric layer as set forth above. It is then determined whether additional reference planes are required at a step 1708. If so, the additional dielectric layers and reference planes are formed. If not, a dielectric layer is formed at a step 1710, and a metal layer having a plurality of conductive traces for coupling signals is formed, wherein conductive traces of the plurality of conductive traces are arranged in a predetermined pattern at a step 1712. The predetermined patterns may include any of the patterns described above with respect to FIGS. 1-16, or may be some other suitable pattern. It is then determined whether additional metal layers are required at a step 1714. If so, the additional metal layers are formed. If not, it is determined whether the multi-layer substrate is to be formed on two sides of a core dielectric layer at a step 1716. If so, the additional metal layers are formed at a step 1718 on the opposite side of the core dielectric layer according to steps 1710-1714. It should be understood that the steps of the methods of FIG. 17 could be implemented according to any of the arrangements of FIGS. 1-16 as described above, or other suit able arrangements, where the layers may be formed simultaneously on both sides of the core as described above.

It can therefore be appreciated that the new and novel integrated circuit device having a multi-layer substrate and a method of enabling signals to be routed in a multi-layer substrate has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. An integrated circuit device having a multi-layer substrate coupled to receive an integrated circuit die and enabling fixed voltage reference signals of a power distribution network and input/output signals to be routed in the integrated circuit device, the multi-layer substrate comprising:

a first metal layer having a first plurality of conductive traces extending outward from a region for receiving the integrated circuit die toward an end of the multi-layer substrate;

a dielectric layer positioned on the first metal layer; and a second metal layer, which is positioned on the dielectric layer and adjacent to the first metal layer, having a second plurality of conductive traces extending outward from the region for receiving the integrated circuit die toward the end of the multi-layer substrate, wherein the first and second metal layers are separated only by the dielectric layer;

wherein each of the first plurality of conductive traces and the second plurality of conductive traces comprises conductive traces for coupling input/output signals and at least one of a first fixed voltage reference signal and a second fixed voltage reference signal;

wherein each conductive trace for coupling an input/output signal of the first plurality of conductive traces and the second plurality of conductive traces has adjacent, on each side, a conductive trace for coupling one of the first fixed voltage reference signal and the second fixed voltage reference signal; and wherein the first plurality of conductive traces and the second plurality of conductive traces are staggered in the region for receiving the integrated circuit die so that conductive traces routing input/output signals of the first plurality of conductive traces are not vertically aligned with conductive traces routing input/output signals of the second plurality of conductive traces, and any pair of conductive traces having a conductive trace of the first plurality of conductive traces and a conductive trace of the second plurality of conductive traces in the region for receiving the integrated circuit die which is vertically aligned includes only one conductive trace for routing an input/output signal.

2. The integrated circuit device of claim 1 further comprising a third metal layer having a predetermined pattern of fixed voltage reference signal traces and input/output signal traces, wherein the input/output signal traces of the second metal layer and the third metal layer are staggered.

3. The integrated circuit device of claim 1 further comprising a third metal layer having a predetermined pattern of fixed voltage reference signal traces and input/output signal traces, wherein a pattern of the conductive traces of the second metal layer is different than the predetermined pattern of the third metal layer.

4. The integrated circuit device of claim 1 further comprising a ground signal plane.

5. The integrated circuit device of claim 1 wherein the dielectric layer has a core having a first reference signal plane comprising a ground signal plane on a first side of a core dielectric layer and a second reference signal plane comprising a power signal plane on a second side of the core dielectric layer.

6. The integrated circuit device of claim 1 wherein the first plurality of conductive traces are in a predetermined pattern of power signal traces for coupling the first fixed voltage reference signal, ground signal traces for coupling the second fixed voltage reference signal, and input/output signal traces.

7. A multi-layer substrate coupled to receive an integrated circuit die and enabling fixed voltage reference signals of a power distribution network and input/output signals to be routed, the multi-layer substrate comprising:

a first metal layer having a first plurality of conductive traces for coupling a first fixed voltage reference signal, a second fixed voltage reference signal, and a first plurality of input/output signals to the integrated circuit die;

a dielectric layer positioned on the first metal layer; and a second metal layer, which is positioned on the dielectric layer and adjacent to the first metal layer, having a second plurality of conductive traces for coupling the first fixed voltage reference signal, the second fixed voltage reference signal and a second plurality of input/output signals to the integrated circuit die, wherein the first and second metal layers are separated only by the dielectric layer;

wherein the first plurality of conductive traces and the second plurality of conductive traces extend outward from a region for receiving the integrated circuit die toward an end of the multi-layer substrate, each conductive trace of the first plurality of conductive traces and the second plurality of conductive traces for coupling, in the region for receiving the integrated circuit die, an input/output signal having adjacent, on each side, a conductive trace for coupling one of the first fixed voltage reference signal and the second fixed voltage reference signal, and any pair of conductive traces having a conductive trace of the first plurality of conductive traces and a conductive trace of the second plurality of conductive traces in the region for receiving the integrated circuit die which is vertically aligned includes only one conductive trace for routing an input/output signal.

8. The multi-layer substrate of claim 7 wherein the first plurality of conductive traces of the first metal layer comprises a predetermined pattern of power signal traces for coupling the first fixed voltage reference signal, ground signal traces for coupling the second fixed voltage reference signal, and input/output signal traces.

9. The multi-layer substrate of claim 8 wherein the second plurality of conductive traces of the second metal layer comprises the predetermined pattern of power signal traces for coupling the first fixed voltage reference signal, ground signal traces for coupling the second fixed voltage reference signal, and input/output signal traces.

10. The multi-layer substrate of claim 8 wherein the second plurality of conductive traces of the second metal layer comprises a predetermined pattern of power signal traces, ground signal traces and input/output signal traces which is different than the predetermined pattern of the first metal layer.

11. The multi-layer substrate of claim 7 wherein conductive traces for coupling the first plurality of input/output signals on the first metal layer and the second plurality of input/output signals on the second metal layer are staggered.

12. The multi-layer substrate of claim 7 further comprising a core having a power signal plane and a ground signal place.

13. The multi-layer substrate of claim 12 further comprising a third metal layer on the opposite side of the core from the first and second metal layers, wherein the third metal layer comprises a recurring pattern of power signal traces, ground signal traces and input/output signal traces.

14. A method of forming an integrated circuit device enabling different signals comprising fixed voltage reference signals of a power distribution network and input/output signals to be routed in a multi-layer substrate adapted to receive a die in the integrated circuit device, the method comprising:

forming a first metal layer having a first plurality of conductive traces for coupling first input/output signals and at least one of a first fixed voltage reference signal and a second fixed voltage reference signal, the first plurality of conductive traces extending outward from a region for receiving the integrated circuit die toward an end of the multi-layer substrate;

forming a dielectric layer on the first metal layer;

forming a second metal layer on the dielectric layer and adjacent to the first metal layer, the second metal layer having a second plurality of conductive traces for coupling second input/output signals and at least one of the first fixed voltage reference signal and the second fixed voltage reference signal, wherein the second plurality of conductive traces extends outward from the region for receiving the die toward an end of the multi-layer substrate, wherein the first and second metal layers are separated only by the dielectric layer;

wherein conductive traces of the first plurality of conductive traces and the second plurality of conductive traces for coupling a fixed voltage reference signal of the first fixed voltage reference signal and the second fixed voltage reference signal alternate with the conductive traces for coupling the input/output signals, each conductive trace for coupling an input/output signal having adjacent, on each side, a conductive trace for coupling one of the fixed voltage reference signal and the second fixed voltage reference signal; and wherein the first plurality of conductive traces and the second plurality of conductive traces are staggered in the region for receiving the integrated circuit die so that conductive traces routing input/output signals of the first plurality of conductive traces are not vertically aligned with conductive traces routing input/output signals of the second plurality of conductive traces, and any pair of conductive traces having a conductive trace of the first plurality of conductive traces and a conductive trace of the second plurality of conductive traces in the region for receiving the integrated circuit die which is vertically aligned includes only one conductive trace for routing an input/output signal.

15. The method of claim 14 further comprising forming a third metal layer having conductive traces coupled to a reference plane.

16. The method of claim 14 further comprising forming a core, wherein the core comprises a first reference plane and a second reference plane for coupling the second fixed voltage reference signal to the die.

17. The method of claim 16 wherein forming a second metal layer comprises coupling conductive traces of the second metal layer to the first reference plane and the second reference plane in a predetermined pattern.

18. The method of claim 16 further comprising forming a third metal layer on an opposite side of the core from the second metal layer, the third metal layer comprising a third plurality of conductive traces.

19. The method of claim 18 wherein forming the third metal layer comprises coupling conductive traces of the third metal layer to the reference plane and the second reference plane in a predetermined pattern.

\* \* \* \* \*